United States Patent [19]
Gray

[11] Patent Number: 4,958,079
[45] Date of Patent: Sep. 18, 1990

[54] DETECTOR FOR SCANNING ELECTRON MICROSCOPY APPARATUS

[75] Inventor: John W. Gray, Ware, Mass.

[73] Assignee: Galileo Electro-Optics Corps., Sturbridge, Mass.

[21] Appl. No.: 313,022

[22] Filed: Feb. 21, 1989

[51] Int. Cl.$^5$ ............................................ H01J 37/244
[52] U.S. Cl. .................................. 250/397; 250/305; 250/310; 250/311; 313/103 CM; 313/104; 313/105 CM; 313/399
[58] Field of Search ............... 250/397, 310, 311, 305; 313/103 CM, 104, 105 CM, 399

[56] References Cited

U.S. PATENT DOCUMENTS

| | | | |
|---|---|---|---|
| 3,864,595 | 2/1975 | Lawrence et al. | 313/103 CM |
| 3,896,308 | 7/1975 | Venables et al. | 250/397 |
| 4,177,379 | 12/1979 | Furukawa et al. | 250/397 |
| 4,528,452 | 7/1985 | Livesay | 250/492.24 |
| 4,721,910 | 1/1988 | Bokor et al. | 250/310 |
| 4,728,790 | 3/1988 | Plies | 250/305 |
| 4,752,714 | 6/1988 | Sonneborn et al. | 313/103 CM |
| 4,831,266 | 5/1989 | Frosien et al. | 250/310 |
| 4,868,394 | 9/1989 | Fukubara et al. | 250/397 |
| 4,918,358 | 4/1990 | Aihara et al. | 250/492.2 |

OTHER PUBLICATIONS

Helbig, H. F. et al., "Channel Plate Detection in Low Energy Scanning Electron Microscopy", *Scanning Microscopy*, vol. 1, No. 4 (1987), pp. 1491–1499.

Kruit, P. and Dubbeldam, L., "An Electron Beam Tester with Dispersive Secondary Electron Energy Analyser", *Scanning Microscopy*, vol. 1, No. 4, (1987), pp. 1641–1646.

*Primary Examiner*—Jack I. Berman
*Assistant Examiner*—Kiet T. Nguyen

[57] ABSTRACT

Scanning electron microscopy apparatus employing a detector to detect emission of electrons resulting from the impingement of electrons of an electron beam on an object being viewed, the apparatus including an electron beam source providing the electron beam, a magnet providing a magnetic field to direct the electron beam to the object, a first microchannel plate having a first hole through it aligned with the electron beam, a first surface directed toward the electron beam source for receiving low energy electrons that have been emitted from the object and directed through the hole by the magnetic field, a second surface on the opposite side of side first microchannel plate for discharge of multiplied electrons, and a first anode facing the second surface, the first anode being positioned to collect electrons discharged from the second surface.

8 Claims, 1 Drawing Sheet

DETECTOR FOR SCANNING ELECTRON MICROSCOPY APPARATUS

BACKGROUND OF THE INVENTION

The invention relates to detectors used in scanning electron microscopy.

In scanning electron microscopy, an electron beam bombards a sample and produces three signals: secondary electrons (ejected from very near the surface of the sample with low energy), backscattered electrons (originating deeper in the sample with higher energy), and x-rays. One or more of these signals are detected as the electron beam is moved by a magnetic lens across a small area of the sample to create an enlarged image. Most commercial scanning electron microscopes (SEMs) are provided with one or more detectors essentially dedicated to measuring one of these three signals at a time. Newer SEMs are capable of mixing signals from backscattered and secondary electrons, but still use two separate detectors. In these cases, typically one detector (usually the backscatter detector) is placed directly over the sample, and the other (secondary electron detector) is located off to one side of the sample.

Ring-shaped scintillator detectors have been employed in devices where the electron beam passes through the hole of the ring in its travel to the sample. Microchannel plates (MCPs) have also been used as SEM detectors; an advantage of MCPs is that they are very sensitive to low energy electrons, and low energy electron beams can be used.

Helbig, H. F. et al., "Channel Plate Detection in Low Energy Scanning Electron Microscopy", *Scanning Microscopy*. Vol. 1, No. 4 (1987) pp. 1491–1499 discloses using an MCP (actually two plates connected electrically in series and joined together to form a single resistive element) with a 6 mm center hole as a low profile SEM detector, the electron beam of the SEM passing through the hole, the emitted electrons being detected at the lower, facing surface of the MCP.

Venables et al. U.S. Pat. No. 3,896,308 discloses a detector for an SEM that employs an MCP having a hole through it for passage of an electron beam.

Kruit, P. and Dubbeldam, L., "An Electron Beam Tester with Dispersive Secondary Electron Energy Analyzer", *Scanning Microscopy*. Vol. 1, No. 4, (1987), pp. 1641–1646, discloses using two scintillator detectors to detect backscattered and secondary electrons that are attracted by the magnetic field used in the lens and travel back through the SEM lens to the detectors.

SUMMARY OF THE INVENTION

It has been discovered that a detector for a scanning electron microscope (SEM) can be desirably provided by a microchannel plate (MCP) having a hole through which the electron beam of the microscope travels in one direction and low energy electrons emitted from the object being viewed travel in the other direction. The low energy electrons are attracted to a first surface of the MCP that is directed toward the electron beam source. The electrons are multiplied in passage through the MCP and collected on an anode facing a second surface of the MCP on the opposite side.

In preferred embodiments, a second MCP is placed between the first MCP and the object being viewed, the first MCP receiving secondary electrons and the second MCP receiving backscattered electrons, which are multiplied by the second MCP and directed to a second anode. The first and second anodes are provided by conductive layers on opposite sides of an insulator substrate. A grid is placed between the second MCP and the object being viewed to prevent secondary electrons from passing to the second MCP. The anodes are connected to an SEM video processing circuit via respective decouplers and amplifiers.

The detector has a low profile that permits close spacing between the detector and the sample for good resolution. It also is simple to manufacture and use, and permits use of a low-energy electron beam and low voltages for biasing the MCPs.

Other objects and advantages of the invention will be apparent from the following description of a preferred embodiment thereof and from the claims.

DESCRIPTION OF THE PREFERRED EMBODIMENT

The preferred embodiment will now be described.

Drawings

FIG. is a diagram showing scanning electron microscopy apparatus according to the invention.

Figure 1:
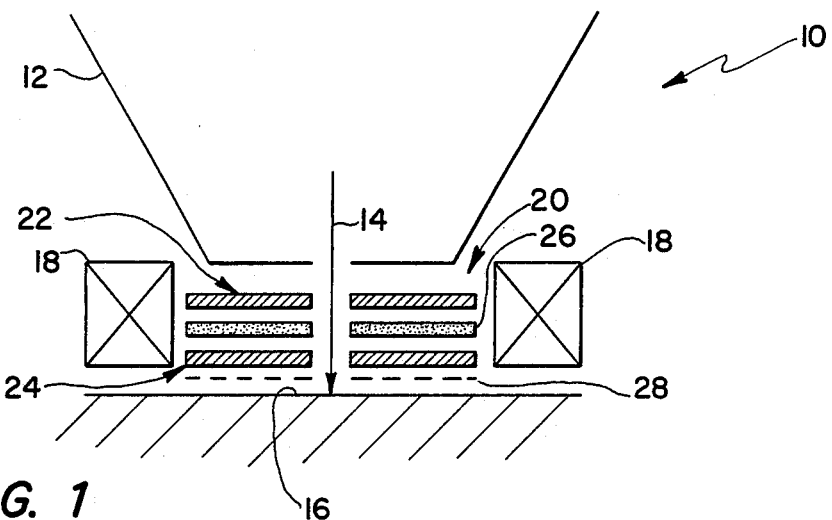
Figure 2:
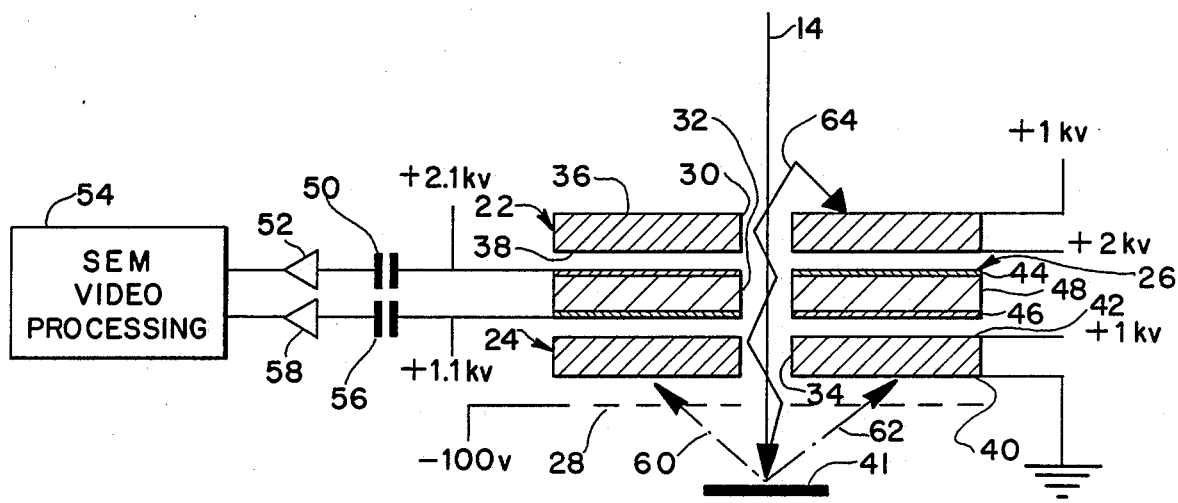

FIG. 2 is a diagram showing components of a detector used in the FIG. 1 apparatus with a video processing circuit of the FIG. 1 apparatus.

Structure

Referring to FIGS. 1 and 2, there is shown scanning electron microscope (SEM) 10 including source 12 of electron beam 14 that is directed toward the surface of table 16 on which an object being viewed is located. Magnet 18 provides the final magnetic focusing stage of the lens of SEM 10. Between source 12 and table 16 is detector 20; it includes first microchannel plate (MCP) 22, second MCP 24, anode sandwich 26, and grid 28, which is located between MCP 24 and table 16.

Referring to FIG. 2, first MCP 22, anode sandwich 26, and second MCP 24 have respective holes 30, 32, 34 through which electron beam 14 passes. First MCP 22 has first surface 36 directed toward electron beam source 12 and second surface 38 on the opposite side for the discharge of multiplied electrons. Second MCP 24 has third surface 40 facing object 4! (which is on table 16) and fourth surface 42 on its opposite side for the discharge of multiplied electrons. Anode sandwich 26 includes metallized layers 44 and 46 deposited on insulator substrate 48 made, e.g., of ceramic material. Metallized layer 44 has an exposed surface facing second surface 38 of first MCP 22 for receiving electrons discharged from second surface 38. Metallized layer 46 similarly has an exposed surface facing fourth surface 42 of second MCP 24 for receiving multiplied electrons discharged from fourth surface 42. Metallized layer 44 provides a first anode, and metallized layer 46 provides a second anode. Microchannel plates 22, 24, (which are 25 mm in diameter and have 6 mm diameter holes) are spaced from facing surfaces 44, 46 of anode sandwich 26 by 0.01 ".

Layer 44 is connected to a voltage source providing 2.1 kV and is also connected by decoupling capacitor 50 and amplifier 52 to scanning electron microscopy video processing circuit 54 used to provide a video image of object 41 on a cathode ray tube (not shown) of SEM 10. Layer 46 is similarly connected to a voltage source providing +1.1 kV and also connected through decoupling capacitor 56 and amplifier 58 to scanning electron microscopy video processing circuit 54. First surface 36 of first MCP 42 is connected to a voltage source providing a +1 kV, as is fourth surface 42 of second MCP 24. Second surface 38 of first MCP 22 is connected to a voltage surface providing +2 kV, and third surface 40 of second MCP 24 is connected to ground. Grid 28 (0.002" thick, photoetched, stainless steel or tungsten, 90% open air/metal ratio) is connected to a voltage source providing −100 V.

OPERATION

In operation, electron beam 14 (about 1000 eV) is provided by electron beam source 12 and directed by magnet 18 to object 41 on table 16. Backscattered electrons, generally indicated by arrows 60, 62, have high energy, are not strongly affected by the lens magnetic field provided by magnet 18, and are accelerated toward third surface 40 of second microchannel plate 24. Because secondary electrons, generally indicated by arrow 64, have less than 100 eV, they are prevented from passing through grid 28 to third surface 40 of second MCP 24. Secondary electrons 64, have low energy, are strongly affected by the lens magnetic field of magnet 18, and are accelerated up through center holes 34, 32, 30 along generally spiral paths. First surface 36 of first MCP 22 is biased to attract the secondary electrons emerging from center hole 30.

Backscattered electrons 60, 62 are multiplied in second MCP 24, and the multiplied electrons are discharged from fourth surface 42 and collected on the second anode metallized layer 46. Secondary electrons 64 are similarly multiplied in first MCP 22, and multiplied electrons are discharged from second surface 38 and collected on the first anode, provided by metallized layer 44. The multiplied electrons collected on the respective anodes provide alternating current signals that pass through the decoupling capacitors 50, 56 and are amplified by the respective amplifiers 52, 58 and used by SEM video processing circuitry 54 to provide an image on a cathode ray tube (not shown) of SEM 10 as electron beam 14 is moved through its raster scan pattern.

Detector 20 desirably has a very low profile that permits close spacing between the detector and sample for good resolution. It also is simple in design and thus inexpensive and easy to use. Because of the sensitivity of the MCPs, a low voltage (1000 eV) energy beam can be used, and low voltages are used for the biasing of MCPs 22, 24.

OTHER EMBODIMENTS

Other embodiments of the invention are within the scope of the following claims.

What is claimed is:

1. Scanning electron microscopy apparatus employing a detector to detect emission of electrons resulting from the impingement of electrons of an electron beam on an object being viewed, said apparatus comprising
  an electron beam source providing said electron beam,
  a magnet providing a magnetic field to direct said electron beam to said object,
  a first microchannel plate having a first hole through it aligned with said electron beam, a first surface directed toward said electron beam source, said first surface being biased for receiving low energy electrons that have been emitted from said object and directed through said hole by said magnetic field, and a second surface on the opposite side of said first microchannel plate that is biased for discharge of multiplied electrons, and
  a first anode facing said second surface, said first anode being positioned to collect electrons discharged from said second surface.

2. The apparatus of claim 1 wherein said low energy electrons are secondary electrons, and further comprising
  a second microchannel plate that is parallel to said first microchannel plate and on the second surface side of said first microchannel plate, said second microchannel plate having a second hole through it that is aligned with said first hole, a third surface for receiving backscattered electrons from said object, and a fourth surface on the opposite side of said second microchannel plate for discharge of multiplied electrons, and
  a second anode that is electrically isolated from said first anode and is positioned between said second and fourth surfaces, said second anode being positioned to collect electrons discharged from said fourth surface.

3. The apparatus of claim 2 wherein said first and second anodes are provided as conductive layers on an insulator substrate.

4. The apparatus of claim 2 further comprising a grid between said third surface and said object, said grid having a potential to prevent said secondary electrons from reaching said third surface.

5. The apparatus of claim 2 further comprising video processing circuitry and a decoupling means and an amplifier between each said anode and said video processing circuitry.

6. A detector for use in scanning electron microscopy to detect emission of secondary electrons and backscattered electrons resulting from the impingement of electrons of an electron beam on an object being viewed, said detector comprising
  a first microchannel plate having a first hole through it, a first surface for receiving secondary electrons, and a second surface on the opposite side of side first microchannel plate for discharge of multiplied electrons,
  a second microchannel plate that is parallel to said first microchannel plate and on the second surface side of said first microchannel plate, said second microchannel plate having a second hole through it that is aligned with said first hole, a third surface for receiving backscattered electrons from said object, and a fourth surface on the opposite side of said second microchannel plate for discharge of multiplied electrons, and
  first and second electrically isolated anodes positioned between said second and fourth surfaces, said first anode being positioned to collect electrons discharged from said second surface, said second anode being positioned to collect electrons discharged from said fourth surface.

7. The apparatus of claim 6 wherein said first and second anodes are provided as conductive layers on an insulator substrate.

8. The apparatus of claim 6 further comprising a grid between said third surface and said object, said grid having a potential to prevent said secondary electrons from reaching said third surface.

* * * * *